United States Patent [19]
Fujii

[11] Patent Number: 5,278,448
[45] Date of Patent: Jan. 11, 1994

[54] SEMICONDUCTOR DEVICE AND METHOD OF FABRICATING THE SAME

[75] Inventor: Toyokazu Fujii, Moriguchi, Japan

[73] Assignee: Matsushita Electric Industrial Co., Ltd., Kadoma, Japan

[21] Appl. No.: 853,536

[22] Filed: Mar. 18, 1992

[30] Foreign Application Priority Data

Mar. 19, 1991 [JP] Japan ............... 3-054528

[51] Int. Cl.$^5$ .......... H01L 23/48; H01L 21/44
[52] U.S. Cl. ............. 257/750; 257/751; 257/763; 257/764; 257/765; 257/774; 437/180; 437/192; 437/194; 437/200
[58] Field of Search ........... 257/750, 763, 764, 765, 257/774; 437/180, 192, 194, 200

[56] References Cited
U.S. PATENT DOCUMENTS

| 4,782,380 | 11/1988 | Shankar et al. | 257/764 |
| 4,985,371 | 1/1991 | Rana et al. | |
| 4,994,410 | 2/1991 | Sun et al. | |
| 5,049,975 | 9/1991 | Ajika et al. | 257/764 |

OTHER PUBLICATIONS

N. S. Tsai et al., "IEEE, IEDM88, Tech. Digest", 1988, pp. 462–465 *Layer Tungsten and Its Applications For VLSI Interconnects.*

H. H. Hoang et al., "Processing, IEEE, 1990", pp. 133–141, Jun. 12/13, 1990 *Barrier Metal Effects on Electro. Of Layer Aluminum Metallization.*

*Primary Examiner*—Edward Wojciechowicz
*Attorney, Agent, or Firm*—Ratner & Prestia

[57] ABSTRACT

A semiconductor device has a multilayered metalization including a CVD tungsten film, a thin buffer layer deposited on the CVD tungsten film by sputtering, and an Al-alloy layer formed on the buffer layer. Due to the existence of the thin buffer layer, the crystal grains of the Al-alloy layer do not become small and the electromigration resistance as wiring is enhanced.

12 Claims, 3 Drawing Sheets

SEMICONDUCTOR DEVICE AND METHOD OF FABRICATING THE SAME

BACKGROUND OF THE INVENTION

1. Field of the Invention

The present invention relates to a semiconductor device and a method of fabricating the same. More particularly, the present invention relates to an improved configuration of metal wiring and an improved method of fabricating the metal wiring.

2. Description of the Prior Art

Recently, as components in a semiconductor device are highly integrated, the line width of metal wiring is reduced and the aspect ratio of a contact hole is increased. Accordingly, the density of current flowing through the wiring becomes high and the step coverage of metal wiring in contact holes is deteriorated. As a result, the reliability of the wiring and the contact holes cannot be ensured.

A known wiring structure in a conventional semiconductor device which can eliminate the above disadvantage is a double-layered structure constituted by an aluminum alloy (Al-alloy) film and a barrier metal film. The double-layered structure is formed in such a manner that the barrier metal film is sputter deposited and then the Al-alloy film is deposited. As the barrier metal film, a refractory metal film or a refractory metal compound film such as a refractory metal nitride film is used.

However, when the components are more highly integrated, and hence, the size of a contact hole is reduced, the barrier metal film formed by sputtering is very thin on the bottom of the contact hole due to the poor step coverage. This causes a problem in that the reliability of contact cannot be ensured. In order to solve the problem, a method has been proposed in which a tungsten film formed by chemical vapor deposition (CVD) (hereinafter, referred to as a CVD tungsten film) is used as the barrier metal film instead of the barrier metal film formed by sputtering. The step coverage is extremely improved when utilizing CVD as compared with the case of sputtering, so that the tungsten film is thickly formed on the bottom of the contact hole, and therefore, the reliability of contact is ensured.

In order to solve the problem of poor step coverage of an Al-alloy film, another method further improved over the above-mentioned method has been proposed. In such method, contact holes are filled with tungsten by depositing a tungsten film to a thickness equal to or larger than a half length of the short side of a contact hole, and then an Al-alloy film is deposited. This improved method, however, has a disadvantage that the film thickness as wiring increases. Therefore, another method has been proposed in which a tungsten film is deposited to a thickness equal to or larger than a half length of the short side of a contact hole, and the tungsten film is used as wiring without depositing an Al alloy. This method still has a disadvantage that the wiring resistance is high because of the absence of an Al alloy. Accordingly, still another method has been reported in which a tungsten film is deposited to a thickness equal to or larger than a half length of the short side of a contact hole, and then the entire surface of the tungsten film is etched to reduce the thickness of the tungsten film. Next, an Al-alloy film is deposited, so that the total film thickness as wiring is reduced. Such a method is reported, for example, in IEEE, IEDM, Technical Digest, pp. 462-465, 1988.

An example of the above-mentioned conventional semiconductor device which is fabricated in such a manner that a tungsten film is deposited to a thickness equal to or larger than a half length of the short side of a contact hole, and then an Al-alloy film is deposited will be described below with reference to FIG. 3.

FIG. 3 is a cross-sectional view showing the main portions of the conventional semiconductor device. In FIG. 3, a first insulating film 2 is formed over a silicon substrate 1. A metal wiring 3, and then a second insulating film 4, are formed on top of the first insulating film 2. A contact hole 5 is formed in the second insulating film 4. A seed layer 6 of a titanium tungsten (TiW) film is formed on the second insulating film 4 and in the contact hole 5 as a seed for the growth of a tungsten film over the insulating film. In the case where a tungsten film is formed over an insulating film, it is necessary to form a seed layer on top of the insulating film, because a CVD tungsten film is not grown on the insulating film. Over the seed layer 6, a CVD tungsten film 7 is formed, and an Al-alloy film 9 is formed thereover.

In the semiconductor device with the above-mentioned configuration, the contact hole is filled with tungsten by forming the CVD tungsten film 7, thereby ensuring the reliability of contact. The multilayered structure of the tungsten film 7 and the Al-alloy film 9 enables the specific resistance to be lowered as compared with a single layer structure of tungsten film. Generally, the surface of the CVD tungsten film 7 is rough, as is shown in FIG. 3.

A comparison in reliability as wiring of a multilayered structure of a barrier metal film and an Al-alloy film between a case where a CVD tungsten film is used as the barrier metal film and a case where a TiW film deposited by sputtering is used as the barrier metal film is reported by H. H. Hoang et al. in Proceeding, IEEE, VMIC Conference, pp. 133-141, 1990. The report mentions that, since the surface of a CVD tungsten film is rough, in the case where the tungsten film is used as the barrier metal film, the crystal grains of the Al-alloy film are small as compared with the case of using the TiW film. Therefore, the reliability as wiring (e.g., the electromigration resistance) is poor. The report further mentions that if the Cu concentration in the Al-alloy film is 2%, there is no difference in reliability between the two cases using the different kinds of barrier metal films.

It is known that the electromigration resistance becomes high with the increase in grain diameter of an Al-alloy film. The electromigration is a phenomenon in which, when electrons flow, the electrons collide with Al atoms to move the Al atoms. It is known that, since the Al atoms are moved along the grain boundaries, in a portion A where plural grain boundaries combine into one as is shown in FIG. 4 along the direction of the flow of electrons, the Al atoms go to excess to cause hillock which results in a short circuit. In a portion B where one grain boundary divides into plural grain boundaries, the Al atoms are not sufficient so as to cause void which results in breaking of wiring. Therefore, as the crystal grain is larger, the number of grain boundaries decreases, and the electromigration resistance is enhanced.

It is also known that the electromigration resistance is enhanced when copper is added as an impurity to Al-alloy, and as the concentration of copper is higher, the effect is further enhanced. It is considered that this is because copper deposits itself on the grain boundaries and suppresses the movement of Al atoms along the grain boundaries.

However, with the above configuration using the Al-alloy film containing 2% copper, there remains a problem in corrosion of wiring. Since it is known that the corrosion of Al alloy is more likely to occur as the concentration of copper becomes higher, the Al-alloy film usually contains 0.5% copper, or 1% copper at the most. With the decrease in size of a semiconductor device, the line width of wiring is further reduced, so that the slight corrosion may cause a defect. Therefore, it becomes further difficult for the Al-alloy film to contain much copper.

SUMMARY OF THE INVENTION

The semiconductor device of this invention, which overcomes the above-discussed and numerous other disadvantages and deficiencies of the prior art, includes: a first conductive layer; an insulating layer covering the conductive layer; a contact hole formed in the insulating layer, the contact hole reaching and exposing a portion of the conductive layer; a seed layer formed over the insulating layer and the exposed portion of the conductive layer; and a second conductive layer formed on the seed layer; the second conductive layer including: a CVD refractory material layer formed on the seed layer; a refractory material buffer layer formed on the CVD refractory material layer; and an aluminum alloy layer formed on the refractory material buffer layer.

In a preferred embodiment, the first conductive layer is a metal layer formed over a semiconductor substrate.

In a preferred embodiment, the first conductive layer is a diffusion layer formed in a semiconductor substrate.

In a preferred embodiment, the CVD refractory material layer is a CVD tungsten layer formed on the seed layer.

In a preferred embodiment, the refractory material buffer layer is made of a titanium nitride or titanium tungsten.

In a preferred embodiment, a thickness of the refractory material buffer layer is 200 nm or smaller.

According to another aspect of the present invention, a method of fabricating a semiconductor device is provided, the method including the steps of: forming a conductive layer; forming an insulating layer so as to cover the conductive layer; forming a contact hole in the insulating layer by selectively etching a portion of the insulating layer, thereby exposing a portion of the conductive layer; forming a seed layer over the insulating layer and the exposed portion of the conductive layer; forming a refractory material layer on the seed layer by CVD; forming a refractory material buffer layer on the CVD refractory material layer; and forming an aluminum alloy layer on the refractory material buffer layer.

In a preferred embodiment, the step of forming the refractory material buffer layer includes the step of cleaning a surface of the refractory material layer with sulfuric acid or fuming nitric acid so as to oxidize the surface of the refractory material layer, thereby forming an oxide layer as the refractory material buffer layer.

In a preferred embodiment, the step of forming the refractory material buffer layer includes the step of annealing a surface of the refractory material layer so as to oxidize the surface of the refractory material layer, thereby forming an oxide layer as the refractory material buffer layer.

In a preferred embodiment, the method further includes the step of etching an entire surface of the refractory material layer before the step of forming the refractory material buffer layer.

In a preferred embodiment, the method further includes the step of forming another refractory material layer as an anti-reflection layer over the aluminum alloy layer.

With the above-such configurations of the invention, the CVD tungsten film has good step coverage, so that the reliability of contact is ensured. The wiring resistance can be reduced by utilizing a multilayered structure of the tungsten film and Al-alloy film. Since a buffer layer is formed between the tungsten and Al-alloy films, even if the surface of the tungsten film is rough, the crystal grains of Al alloy do not become small and the electromigration resistance as wirings is enhanced. Moreover, since the concentration of copper contained in the Al-alloy film can be decreased, corrosion does not occur in the Al-alloy film.

Thus, the invention described herein makes possible the objectives of (1) providing a semiconductor device which has high reliability as wiring (electromigration resistance) and has no probability of corrosion while utilizing an Al-alloy film and a CVD tungsten film; and (2) providing a method of fabricating the same.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Example 1

Figure 1:
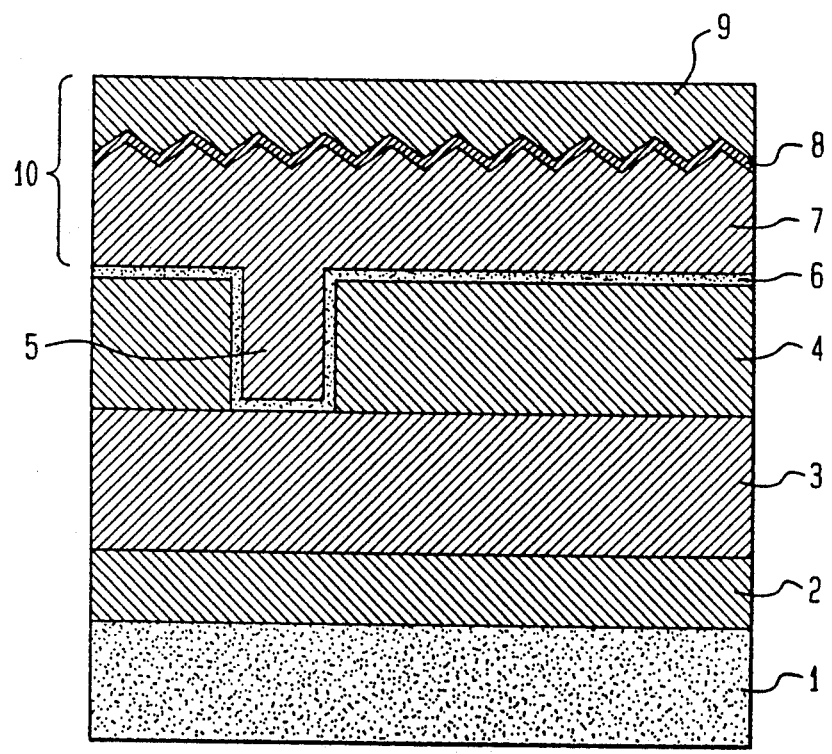
FIG. 1 is a cross-sectional view showing the main portions of a semiconductor device in accordance with a first example of the present invention.

A semiconductor device in one example according to the present invention and a method of fabricating the same will be described with reference to figures. FIG. 1 is a cross-sectional view showing the main portions of the semiconductor in a first example of the invention.

Referring to FIG. 1, a first insulating film 2 is formed over a silicon substrate 1. A metal wiring (a first conductive layer) 3 and then a second insulating film 4 are formed on top of the first insulating film 2. The second insulating film 4 is, for example, 1.5 $\mu$m thick. A contact hole 5 is formed in the second insulating film 4. The length of the short side of the contact hole 5 is, for example, 400 nm. A seed layer 6 which is, for example, a TiW film of 50 nm thickness, is formed on top of the second insulating film 4.

A second conductive layer 10 having a multi-layered structure is formed on the seed layer 6. The second conductive layer 10 includes a CVD tungsten film 7, a buffer layer 8, and an Al-alloy layer 9. The CVD tungsten film 7 is formed over the seed layer 6 to a 300 nm thickness, for example. The seed layer 6 is used as a seed for the growth of the CVD tungsten film 7. Since a CVD tungsten film is not grown on an insulating film, when a CVD tungsten film is to be formed over an insulating film, it is necessary to form a seed layer over the insulating film. The buffer layer 8 which is, for example, a titanium nitride (TiN) film of 50 nm thickness, is formed over the tungsten film 7. Tha Al-alloy film 9 is deposited on the buffer layer 8 by sputtering and the thickness of the Al-alloy film 9 is, for example, 300 nm.

Next, the method of fabricating the semiconductor in the first example will be described referring to FIG. 1. As the first insulating film 2, for example, a silicon oxide film is formed over the silicon substrate 1. Next, as the metal wiring 3, for example, a tungsten silicide film is formed on top of the first insulating film 2. Thereafter, over the entire surface of the metal wiring 3, as the second insulating film 4, for example, a silicon oxide film is deposited to 1.5 $\mu$m thickness. Following this, a contact hole 5 is formed in the second insulating film 4 using known etching techniques. The short side of the contact hole is, for example, 400 nm long. Next, as the seed layer 6, for example, a TiW film is deposited to a 50 nm thickness, and then the tungsten film 7 is deposited to, for example, a 300 nm thickness by CVD as expressed by reaction formula (1).

$$2WF_6 + 6H_2 \rightarrow 2W + 12HF \qquad (1)$$

The seed layer 6 is used as a seed for the formation of the tungsten film 7. In this process, after forming the tungsten film 7, the thickness of tungsten film 7 may be reduced by etching the entire surface thereof.

Thereafter, as the buffer layer 8, for example, a TiN film is deposited by sputtering to a 50 nm thickness, and then the Al-alloy film 9 is deposited by sputtering to, for example, a 300 nm thickness. In this process, after depositing the TiN film, the Al-alloy film 9 is not successively deposited, but the Al-alloy film 9 may be deposited either after forming a native oxide film over the surface of the TiN film by exposing the surface of the TiN film to the atmosphere, or after heat-treating the TiN film, for example, in a nitrogen atmosphere for 15 minutes at 650° C. Then, the Al-alloy film 9, buffer layer 8, tungsten film 7 and seed layer 6 are patterned using known lithography and dry etching techniques so as to make a desired metal wiring pattern.

In this example, the thickness of the buffer layer 8 is 50 nm. If the buffer layer 8 is made thicker, the advantage in wiring resistance by utilizing the multilayered structure is eliminated. This example will be described in more detail referring to the case where the thickness of the metal wiring is 700 nm. In the above-described configuration, the specific resistances of the tungsten film 7, the TiN film as the buffer layer 8, and the Al-alloy film 9 are approximately 10 $\mu\Omega\cdot$ cm, 60 $\mu\Omega\cdot$ cm, and 4 $\mu\Omega\cdot$ cm, respectively. Under these conditions, the thicknesses of the buffer layer 8 and the Al-alloy film 9 are obtained so that the wiring resistances are equal in both the cases where the metal wiring of 700 nm thickness includes the seed layer 6 of 50 nm thickness and the tungsten film 7 of 650 nm thickness, and where the metal wiring includes the seed layer 6 of 50 nm thickness, the tungsten film 7 of 300 nm thickness, the buffer layer 8, and the Al-alloy film 9. As a result, when the buffer layer 8 is 200 nm thick and the Al-alloy film 9 is 150 nm thick, the wiring resistances are equal.

In other words, if the thickness of the buffer layer 8 which has the high specific resistance is set to 200 nm or larger, it is necessary to set the thickness of the Al-alloy film 9 which has the low specific resistance to 150 nm or smaller so as to form the metal wiring of 700 nm thickness. As a result, the wiring resistance increases. The Al-alloy film 9 and the tungsten film 7 are multi-layered in order to reduce the wiring resistance, so that the merit of multilayered structure is eliminated when the wiring resistance is higher than the single layer structure of the tungsten film 7. Therefore, in the above-mentioned configuration, the thickness of the buffer layer 8 preferably should be 200 nm or smaller.

Figure 2A:
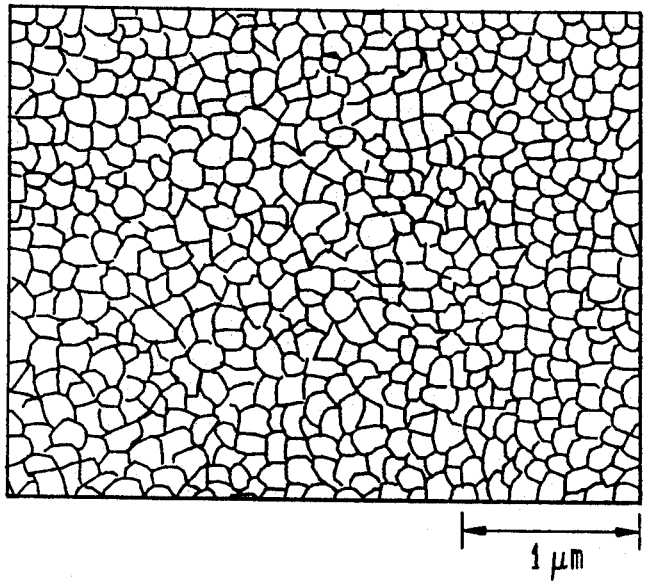
FIG. 2A is a typical view showing the grain diameter of an Al-alloy film in a prior art.
Figure 2B:
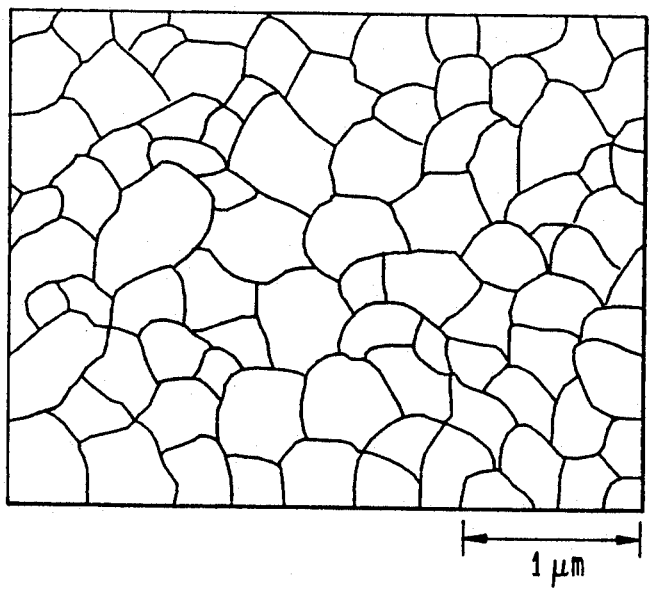
FIG. 2B is a typical view showing the grain diameter of an Al-alloy film in accordance with the first example of the present invention.
Figure 3:
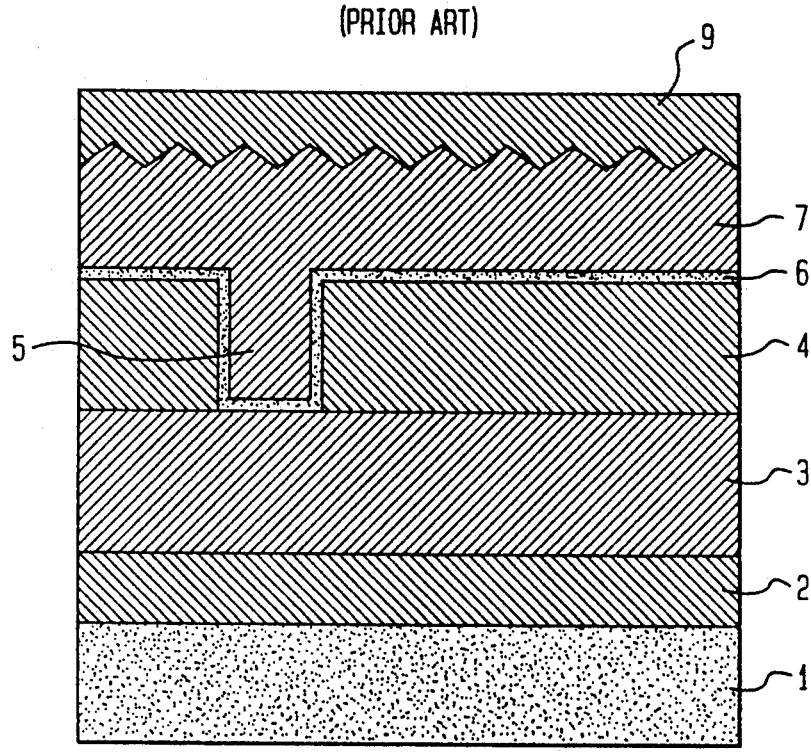
FIG. 3 is a cross-sectional view showing the main portions of a prior art semiconductor device.
Figure 4:
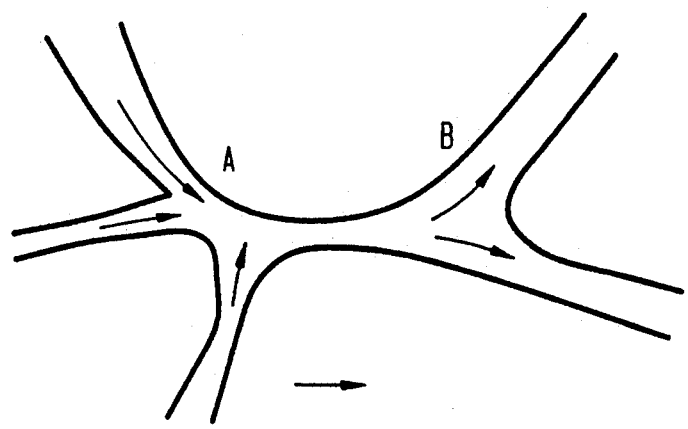
FIG. 4 is a typical view showing the surface of the Al-alloy film for illustrating the electromigration.

In the semiconductor device with the above-mentioned configuration fabricated by the above-mentioned method, the multilayered structure of the Al-alloy film and the tungsten film is heat-treated in order to investigate the grain diameter of the Al-alloy film. FIGS. 2A and 2B show typical views of crystal grains at the surface of Al-alloy film after the heat treatment. FIG. 2A shows the surface of the conventional structure without a buffer layer, and FIG. 2B shows the surface of the structure of this example shown in FIG. 1. The Al-alloy film contains 0.5% copper and 1.0% silicon as impurities. The heat treatment is conducted for 30 minutes at 450° C. In order to reduce the influence by the rough surface of the tungsten film 7, the thickness of the tungsten film 7 is set to be 100 nm. When the tungsten film 7 is 100 nm thick, it is observed by an electronic microscope that the differences between ups and downs of the surface thereof do not exceed 5 nm which is the limit of observation by the microscope.

As is seen from FIGS. 2A and 2B, the grain diameter is 0.1 $\mu$m–0.15 $\mu$m when he buffer layer 8 is not formed, and the grain diameter is 0.3 $\mu$m–0.6 $\mu$m when a TiN film as the buffer layer 8 is formed. The larger crystal grains enhance the reliability as wiring. It is observed by the electron microscope that both the differences between ups and downs of the surfaces of the tungsten film 7 and the buffer layer 8 do not exceed 5 nm which is the limit of observation by the microscope. These differences are far smaller than the differences between ups and downs of the surface in the prior art, i.e., 50 nm–500 nm. This indicates that the reliability is deteriorated not only by the rough surface of the tungsten film 7 as conventionally mentioned, but also by other possible causes. One of the causes may be the action of at least any one of fluorine, hydrogen, and HF contained in the tungsten film 7 as expressed in reaction formula (1). A tungsten film formed by CVD and a tungsten film formed by sputtering are greatly different in roughness of the surface, as well as in the amounts of fluorine (in the order of $10^{20}/cm^3$), hydrogen, and HF. Large amounts of fluorine, hydrogen, and HF are contained in the tungsten film formed by CVD as impurities. The diffusion of the fluorine, hydrogen, and HF into the Al-alloy film 9 is prevented by the buffer layer 8, so that the reliability as wiring is enhanced when the buffer layer 8 is provided.

In the fabricating method as is described above, since the existing equipment is used, investment in new equipment is not required.

The TiN film is used as the buffer layer 8 in this example. Alternatively, a Ti film, a TiW film, or a refractory metal silicide film, a refractory metal nitride film, or a refractory metal oxide film may be used. The thicknesses of the second insulating film 4, seed layer 6, tungsten film 7, buffer layer 8, and Al-alloy film 9 may be set to other values, and the length of the short side of the contact hole 5 may also be set differently. With a configuration in which the contact hole 5 reaches a diffusion layer formed in the silicon substrate 1, the same effect as this example can be attained. Furthermore, with a configuration in which a refractory metal film or a refractory metal compound film is formed on the Al-alloy film 9 as an anti-reflection film, the same effect as this example can be attained.

Example 2

As a method of forming the buffer layer 8, a second example of the present invention will now be described. In the second example, after the tungsten film 7 is formed by the method of fabricating the semiconductor device with the configuration shown in FIG. 1, the surface of the tungsten film 7 is oxidized by cleaning the surface thereof with sulfuric acid or fuming nitric acid so as to form a tungsten oxide film as the buffer layer 8 over the tungsten film 7.

With the configuration of this example, the diameter of the crystal grains of the Al-alloy film 9 become larger, i.e., 0.2 $\mu$m-0.4 $\mu$m, as compared to the case where the tungsten oxide film is not provided, whereby the reliability as wiring is enhanced. The buffer layer can be formed in a single cleaning step to be added, so that the process remains simple. Existing equipment which is used for cleaning can be used for such cleaning step so that additional equipment is not required. However, since the tungsten oxide film is an insulating film, the resistance between the tungsten film 7 and the Al-alloy film 9 becomes high and hence the contact resistance becomes high, as compared with the case of the TiN film. The buffer layer 8 has less effect than the buffer layer 8 formed by oxidizing with heat treatment which is described below in a third example.

In this second example, the tungsten oxide film is formed by cleaning with sulfuric acid or fuming nitric acid. The cleaning may be conducted with any acid which does not melt the tungsten film. In the case where, after the tungsten film is formed, the tungsten film is opened to the atmosphere so as to form a tungsten oxide film as a native oxide film over the surface of the tungsten film, the reliability is inferior to that of this example, but superior to the case where the native oxide film is not formed.

Example 3

As an alternate method of forming the buffer layer 8, a third example of the present invention will be described below.

In the third example, after the tungsten film 7 is formed by the method of fabricating the semiconductor device with the configuration shown in FIG. 1, the surface of the tungsten film 7 is oxidized by heat-treating the surface thereof so as to form a tungsten oxide film as the buffer layer 8 over the tungsten film 7. Specifically, the tungsten film 7 is heat-treated, for example, in an atmosphere containing 5% oxygen for 15 minutes at 400° C. The atmosphere may contain an inert gas such as nitrogen or argon.

With the configuration of this example, the crystal grains of the Al-alloy film 9 become large, for example, 0.3 $\mu$m-0.6 $\mu$m in diameter, so that the reliability as wiring is enhanced. As compared with the second example, the reliability is enhanced due to the thick tungsten oxide film, but the resistance between the tungsten film 7 and the Al-alloy film 9 becomes high, and hence the contact resistance further becomes high.

In this example, the tungsten oxide film is formed by heat-treating in the atmosphere containing 5% oxygen for 15 minutes at 400° C. Alternatively, if the conditions are established so as to form a tungsten oxide film of 5 nm-50 nm thickness over the surface of the tungsten film, the same effect can be achieved by heat-treating under the thus established conditions.

Example 4

As yet another method of forming the buffer layer 8, a fourth example of the present invention will be described below.

In the fourth example, after the tungsten film 7 is formed by the method of fabricating the semiconductor device with the configuration shown in FIG. 1, the tungsten film 7 is nitrided by heat-treating in an ammonia atmosphere or by plasma treating in a nitrogen atmosphere so as to form a tungsten nitride film as the buffer layer 8 over the tungsten film 7.

With the configuration of this example, the crystal grains in the Al-alloy film 9 do not become small, so that the reliability as wiring is enhanced. Since the tungsten nitride film is a conductive film, the contact resistance does not become high. However, the number of steps in the process is increased.

In this example, the tungsten nitride film is formed by heat-treating in an ammonia atmosphere or by plasma treating in a nitrogen atmosphere. If the conditions are established so as to form a tungsten nitride film of 5 nm-50 nm thickness, the desired effect can be achieved under the thus established conditions.

According to the invention, as is described above, a refractory metal film or a refractory metal compound film is provided as a buffer layer between the CVD tungsten film and the Al-alloy film formed by sputtering. Therefore, the crystal grains of the Al-alloy film do not become small and the electromigration resistance as wiring is enhanced. The CVD tungsten film has good step coverage, so that the reliability as contact is ensured. The multilayered structure of a tungsten film and an Al-alloy film enables the wiring resistance to be lowered. Moreover, since the concentration of copper contained in the Al-alloy film can be lowered, the corrosion does not occur in the Al-alloy film, thereby achieving an advantageous great effect in practical use.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:
1. A semiconductor device comprising:
a first conductive layer;
an insulating layer covering said conductive layer;

a contact hole formed in said insulating layer, said contact hole reaching and exposing a portion of said conductive layer;

a seed layer formed over said insulating layer and said exposed portion of said conductive layer, said seed layer provided for growth of a portion of a second conductive layer thereon; and said second conductive layer formed on said seed layer comprising: a CVD refractory material layer formed on said seed layer; an electromigration resistance enhancing refractory material buffer layer formed on said CVD refractory material layer; and an aluminum alloy layer formed on said refractory material buffer layer.

2. A semiconductor device according to claim 1, wherein said first conductive layer is a metal layer formed over a semiconductor substrate.

3. A semiconductor device according to claim 1, wherein said first conductive layer is a diffusion layer formed in a semiconductor substrate.

4. A semiconductor device according to claim 1, wherein said CVD refractory material layer is a CVD tungsten layer formed on said seed layer.

5. A semiconductor device according to claim 1, wherein said refractory material buffer layer is made of at least one of a titanium nitride and titanium tungsten.

6. A semiconductor device according to claim 1, wherein a thickness of said refractory material buffer is approximately 200 nm or smaller.

7. A method of fabricating a semiconductor device, said method comprising the steps of:

forming a conductive layer;

forming an insulating layer so as to cover said conductive layer;

forming a contact hole in said insulating layer by selectively etching a portion of said insulating layer, thereby exposing a portion of said conductive layer;

forming a seed layer over said insulating layer and said exposed portion of said conductive layer, said seed layer formed for growing a portion of a second conductive layer;

forming a refractory material layer on said seed layer by CVD;

forming an electromigration resistance enhancing refractory material buffer layer on said CVD refractory material layer; and forming an aluminum alloy layer on said refractory material buffer layer.

8. A method according to claim 7, wherein said step of forming said refractory material buffer layer comprises the step of cleaning a surface of said refractory material layer with sulfuric acid or fuming nitric acid to oxidize said surface of said refractory material layer, thereby forming an oxide layer as said refractory material buffer layer.

9. A method according to claim 7, wherein said step of forming said refractory material buffer layer comprises the step of annealing a surface of said refractory material layer to oxidize said surface of said refractory material layer, thereby forming an oxide layer as said refractory material buffer layer.

10. A method according to claim 7, wherein said method further comprises the step of etching an entire surface of said refractory material layer before said step of forming said refractory material buffer layer.

11. A method according to claim 7, wherein said method further comprises the step of forming another refractory material layer as an anti-reflection layer over said aluminum alloy layer.

12. A semiconductor device according to claim 1, wherein said refractory material buffer layer is made of a material selected from the group of:

titanium, refractory metal silicide, refractory metal nitride, or refractory metal oxide.

* * * * *